United States Patent
Gui et al.

(10) Patent No.: US 7,426,076 B2
(45) Date of Patent: Sep. 16, 2008

(54) PROJECTION SYSTEM FOR A LITHOGRAPHIC APPARATUS

(75) Inventors: Cheng-Qun Gui, Best (NL); Pieter Willem Herman De Jager, Rotterdam (NL); Robert D. Harned, Redding, CT (US); Nora-Jean Harned, Redding, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 311 days.

(21) Appl. No.: 11/019,672

(22) Filed: Dec. 23, 2004

(65) Prior Publication Data

US 2006/0139745 A1 Jun. 29, 2006

(51) Int. Cl.
*G02B 17/06* (2006.01)
*G02B 21/16* (2006.01)

(52) U.S. Cl. .................................................. 359/366
(58) Field of Classification Search .................. 359/366
See application file for complete search history.

(56) References Cited

U.S. PATENT DOCUMENTS

| | | | |
|---|---|---|---|
| 4,011,011 A | 3/1977 | Hemstreet et al. | |
| 5,229,872 A | 7/1993 | Mumola | |
| 5,285,236 A * | 2/1994 | Jain | 355/53 |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 7,158,215 B2 | 1/2007 | Harned et al. | |
| 7,184,124 B2 | 2/2007 | Harned et al. | |

(Continued)

FOREIGN PATENT DOCUMENTS

WO   WO 98/33096   7/1998

(Continued)

*Primary Examiner*—Joshua L Pritchett
(74) *Attorney, Agent, or Firm*—Sterne, Kessler, Goldstein & Fox P.L.L.C.

(57) ABSTRACT

A projection system for a lithographic apparatus having a plurality of mirror imaging systems. In an embodiment, the mirror imaging systems are arranged in two rows with each row being perpendicular to a scanning direction of the projection system. Each mirror imaging systems has an associated imaging field. The mirror imaging systems are arranged in a manner that precludes gaps between adjacent imaging fields in the scanning direction. Each mirror imaging system includes a concave mirror and a convex mirror arranged concentrically with the concave mirror. The concave mirrors have a first mirror portion and a second mirror portion that are independently movable. In one embodiment, each of the mirror imaging systems has an associated phase, and the mirror imaging systems in one row are positioned 180 degrees out of phase with the mirror imaging systems in the other row.

13 Claims, 5 Drawing Sheets

U.S. PATENT DOCUMENTS

| | | | |
|---|---|---|---|
| 2001/0026367 A1* | 10/2001 | Magome | 356/521 |
| 2003/0137644 A1* | 7/2003 | Tanaka et al. | 355/67 |
| 2004/0041104 A1 | 3/2004 | Liebregts et al. | |
| 2004/0130561 A1 | 7/2004 | Jain | |
| 2004/0263429 A1* | 12/2004 | Harned et al. | 345/12 |
| 2005/0007572 A1 | 1/2005 | George et al. | |
| 2005/0237505 A1 | 10/2005 | Harned et al. | |
| 2007/0195304 A1 | 8/2007 | Harned et al. | |

FOREIGN PATENT DOCUMENTS

| | | |
|---|---|---|
| WO | WO 98/38597 | 9/1998 |

* cited by examiner

US 7,426,076 B2

PROJECTION SYSTEM FOR A LITHOGRAPHIC APPARATUS

FIELD OF THE INVENTION

The present invention relates to a projection system, which is particularly suited for use in a lithographic apparatus, and applications thereof.

BACKGROUND OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. Pat. No. 4,011,011 describes an example optical arrangement for a lithographic apparatus, which is known as a Micralign system. As can be seen from, for example, FIG. 3 of U.S. Pat. No. 4,011,011, this arrangement uses a primary concave mirror arranged concentrically with a secondary convex mirror to project light from a mask onto a wafer. The light is directed from the mask towards the primary concave mirror by a flat mirror arranged at 45 degrees to the optical axis of the primary concave mirror, and is then directed away from the primary concave mirror towards the wafer by a second flat mirror arranged at 45 degrees to the optical axis of the primary concave mirror.

While lithographic apparatuses having an optical system such as, for example, that described in U.S. Pat. No. 4,011,011, work well for their intended purposes, there is a present demand for lithographic apparatuses capable of producing a larger exposure field, especially for the manufacturing of active matrix thin film transistor liquid crystal displays.

BRIEF SUMMARY OF THE INVENTION

The present invention provides a projection system for a lithographic apparatus and applications thereof. In an embodiment, the projection system includes several mirror imaging systems. The mirror imaging systems are arranged in two rows with each row being perpendicular to a scanning direction of the projection system. Each mirror imaging systems has an associated imaging field. The mirror imaging systems are arranged in a manner that precludes gaps between adjacent imaging fields in the scanning direction, thereby forming an enlarged exposure field.

In one embodiment, each mirror imaging system includes a concave mirror and a convex mirror arranged concentrically with the concave mirror. The concave mirrors have a first mirror portion and a second mirror portion that are independently movable.

In an embodiment, each of the mirror imaging systems has an associated phase. Mirror imaging systems in a first row are positioned 180 degrees out of phase with respect to the mirror imaging systems in a second row.

In embodiments, each mirror imaging system also includes a first flat mirror and second flat mirror arranged to direct an input beam of radiation to the concave mirror. The flat mirrors are arranged so as to receive an image from a reticle and to reflect the image to the concave mirror in such a way that the orientation of the image at a substrate is the same as the orientation of the corresponding portion of the reticle producing the image. The final image formed by all of the mirror imaging systems at the substrate corresponds with the reticle as a whole. A third flat mirror may also be included and arranged to reflect light from the concave mirror to the substrate.

It is a feature of the present invention that the multiple imaging fields associated with the mirror imaging systems result in an enlarged exposure field suitable, for example, for manufacturing active matrix thin film transistor liquid crystal displays.

Further embodiments, features, and advantages of the present invention, as well as the structure and operation of the various embodiments of the present invention, are described in detail below with reference to the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

The present invention provides a projection system for a lithographic tool, and applications thereof. In an embodiment, the projection system includes several mirror imaging systems. The mirror imaging systems are arranged in two rows with each row being perpendicular to a scanning direction of the projection system. Each mirror imaging systems has an associated imaging field. The mirror imaging systems are arranged in a manner that precludes gaps between adjacent imaging fields in the scanning direction. Each mirror imaging system includes a concave mirror and a convex mirror arranged concentrically with the concave mirror. The concave mirrors have a first mirror portion and a second mirror portion that are independently movable. In one embodiment, each of the mirror imaging systems has an associated phase, and the mirror imaging systems in one row are positioned 180 degrees out of phase with the mirror imaging systems in the other row.

The multiple imaging fields of the mirror imaging systems result in an enlarged exposure field suitable, for example, for manufacturing active matrix thin film transistor liquid crystal displays.

Figure 1:
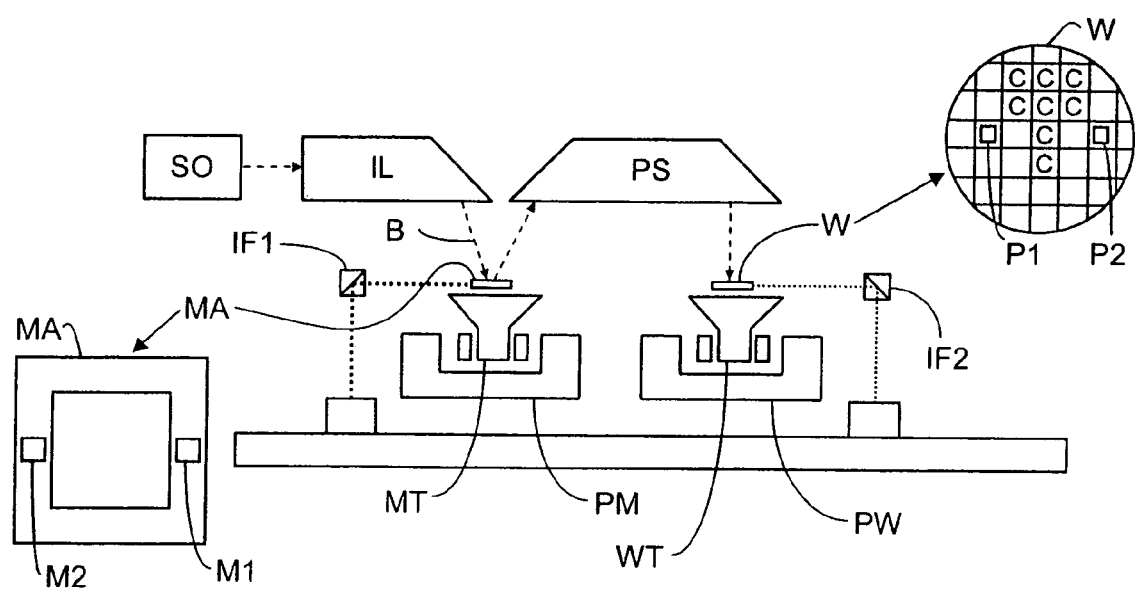
FIG. 1 depicts a lithographic apparatus in which the invention may be employed.

FIG. 1 schematically depicts a lithographic apparatus according to one embodiment of the invention. The apparatus includes an illumination system or illuminator IL configured to condition a radiation beam B (e.g., UV radiation). A support structure (e.g., a mask table) MT supports a patterning device (e.g., a mask) MA. The support structure MT is connected to a first positioner PM, which positions the patterning device MT. Although patterning device MT is shown in FIG. 1, for example, as a reflective mask, it should be understood that a transmissive mask may alternatively be used. A substrate table (e.g., a wafer table) WT holds a substrate (e.g., a resist-coated wafer) W. Substrate table WT is connected to a second positioner PW that positions the substrate. A projection system (e.g., a reflective projection lens system) PS projects a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports (bears the weight of) the patterning device MA. It holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. Any use of the terms "reticle" or "mask" herein may be considered synonymous with the more general term "patterning device." It also should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Systems using programmable mirror arrays, programmable LCD panels, or other controllable light modulating elements are sometimes referred to as "maskless" systems. The invention can be used with both masked and maskless systems. Masks are well known in lithography and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS is further described below with reference to FIGS. 2-6.

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. These immersion techniques increase the numerical aperture of projection systems. The term "immersion" as used herein does not mean that a structure, such as a substrate, must be submerged in liquid, but rather only means that liquid is located between the projection system and the substrate during exposure.

Referring to FIG. 1, in operation, the illuminator IL receives a radiation beam from a radiation source SO. The radiation source SO and the lithographic apparatus may be separate entities, for example, when the source is an excimer laser. In such cases, the radiation source SO is not considered to form part of the lithographic apparatus and the radiation beam is passed from the radiation source SO to the illuminator IL with the aid of a beam delivery system (not shown) comprising, for example, suitable directing mirrors and/or a beam expander. In other cases, the radiation source SO may be an integral part of the lithographic apparatus, for example, when the radiation source is a mercury lamp. The radiation source SO and the illuminator IL, together with the beam delivery system, if required, may be referred to as a radiation system.

The illuminator IL may comprise an adjuster (not shown) for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator and a condenser. The illuminator IL may be used to condition the radiation beam B, to have a desired uniformity and intensity distribution in its cross-section.

The radiation beam B is incident on the patterning device MA, which is held on the support structure MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g., an interferometric device, linear encoder, or capacitive sensor), the substrate table WT can be moved, e.g., so as to position different target portions C in the path of the radiation beam B. Similarly, the first positioner PM and another position sensor IF1 can be used to position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed.

Patterning device MA and substrate W may be aligned, for example, using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

In one embodiment, the lithographic apparatus of FIG. 1 is used in a scan mode. In scan mode, the mask table MT and the substrate table WT are scanned synchronously while a pattern imparted to the radiation beam is projected onto a target portion C (e.g., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another embodiment of the lithographic apparatus of FIG. 1, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes, for example, a programmable patterning device such as a programmable mirror array of a type referred to above.

Combinations and/or variations on the above described modes of use, or entirely different modes of use, may also be employed in the lithographic apparatus.

Figure 2:
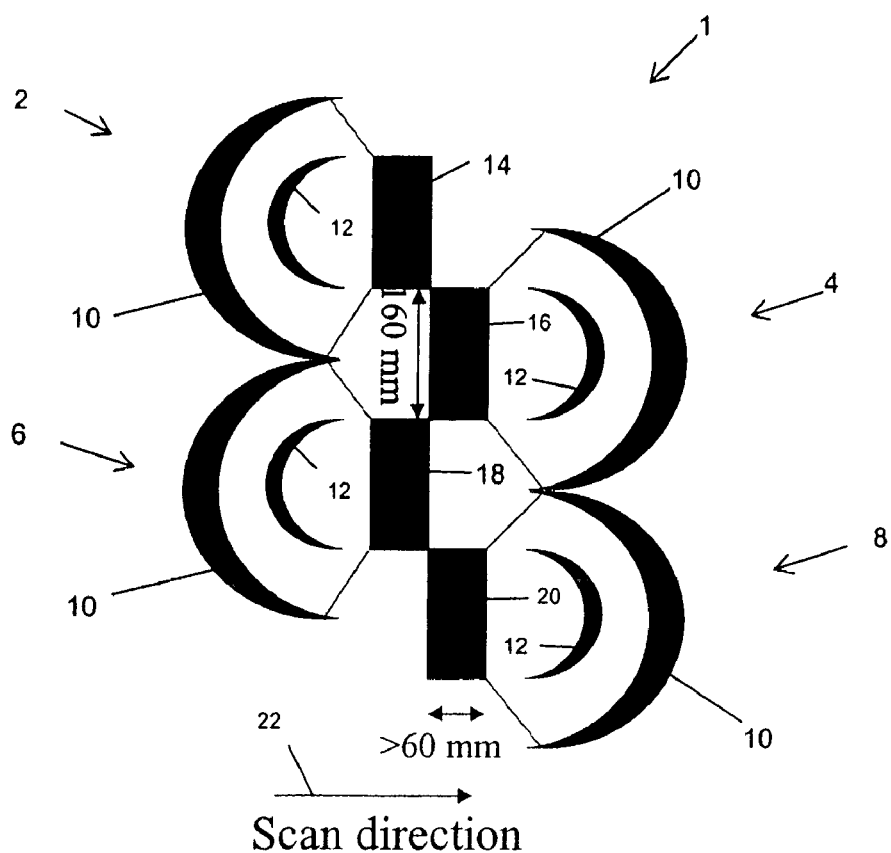
FIG. 2 is a schematic diagram showing the layout of a projection system comprising multiple mirror imaging systems in accordance with an embodiment of the invention.

FIG. 2 is a schematic drawing showing a projection system 1 in accordance with an embodiment of the present invention. As shown FIG. 2, projection system 1 includes four mirror imaging systems 2, 4, 6 and 8. Each of these mirror imaging system comprises a concave mirror 10, and a smaller convex mirror 12, arranged concentrically with the concave mirror 10. Other projection systems according to the present invention have a greater or lesser number of mirror imaging systems.

Each of the mirror imaging system 2, 4, 6, and 8 can be regarded as a separate "column", and the projection system can therefore be regarded as a multi-column system.

The mirror imaging systems 2, 4, 6 and 8 project and focus light onto imaging fields 14, 16, 18 and 20 respectively. In the embodiment shown in FIG. 2, the mirror imaging systems 2, 4, 6 and 8 are arranged such that the imaging fields 14, 16, 18, and 20 touch and overlap each other at their corners. This allows the substrate W to be scanned in the scanning direction indicated by arrow 22 in FIG. 2. As will become apparent to persons skilled in the relevant art(s) given the description herein, such an arrangement is particularly advantageous in the production of flat panel displays. The scanning of relatively large flat panels with a single mirror imaging system would require a convex lens having a diameter of about 1 meter or greater, which would be costly to manufacture to the required tolerances. The embodiment of FIG. 2 solves this problem by allowing a number of much smaller mirror imaging systems to be used.

In embodiments, each of the imaging fields 14, 16, 18, 20 of projection system 1 is arcuate or banana-shaped (rather than rectangular as shown in FIG. 2). In one embodiment, the imaging fields 14, 16, 18, 20 each has a width of, for example, 60 mm and a length of, for example, 160 mm.

The diameter of each of the convex mirrors 10 of projection system 1 is chosen to be almost twice the length of the imaging fields 14, 16, 18, and 20 (e.g., about 320 mm or slightly less). Selected concave mirrors 10 are positioned on opposite sides of their respective imaging fields, as shown in FIG. 2. This allows each concave mirror 10 to be as large as possible. It will be appreciated that the mirror imaging systems 2, 4, 6 and 8 may be arranged such that there is a slight overlap of the rectangular imaging fields 14, 16, 18 and 20 in the non-scanning direction. Such an arrangement may be used to help to ensure that there is good seaming between the imaging fields.

It is a feature of the multi-column projection system 1 that in each column the focus, dose, alignment, and magnification can be set independently. This allows, for example, for adjustments to be made to follow the substrate topology and to allow for substrate imperfections.

Figure 3:
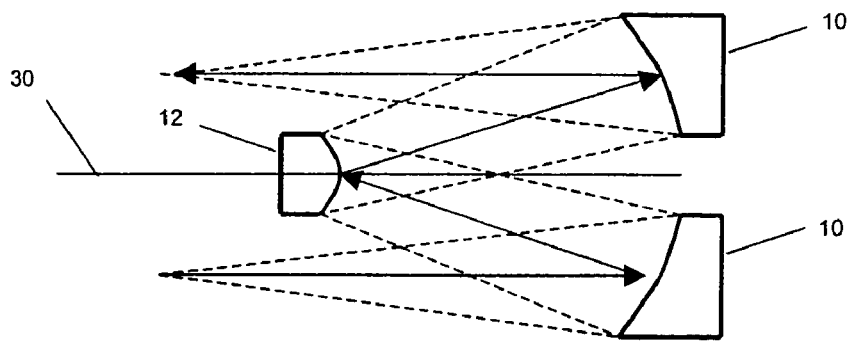
FIG. 3 is a cross-sectional view showing the arrangement of the mirrors in one of the mirror imaging systems of FIG. 2.

FIG. 3 is a more detailed, cross-sectional view through one of the mirror imaging systems 2, 4, 6, 8 of FIG. 2 showing the arrangement of the mirrors. As shown in FIG. 3, concave mirror 10 and convex mirror 12 are arranged concentrically about an optical axis 30.

Figure 4:
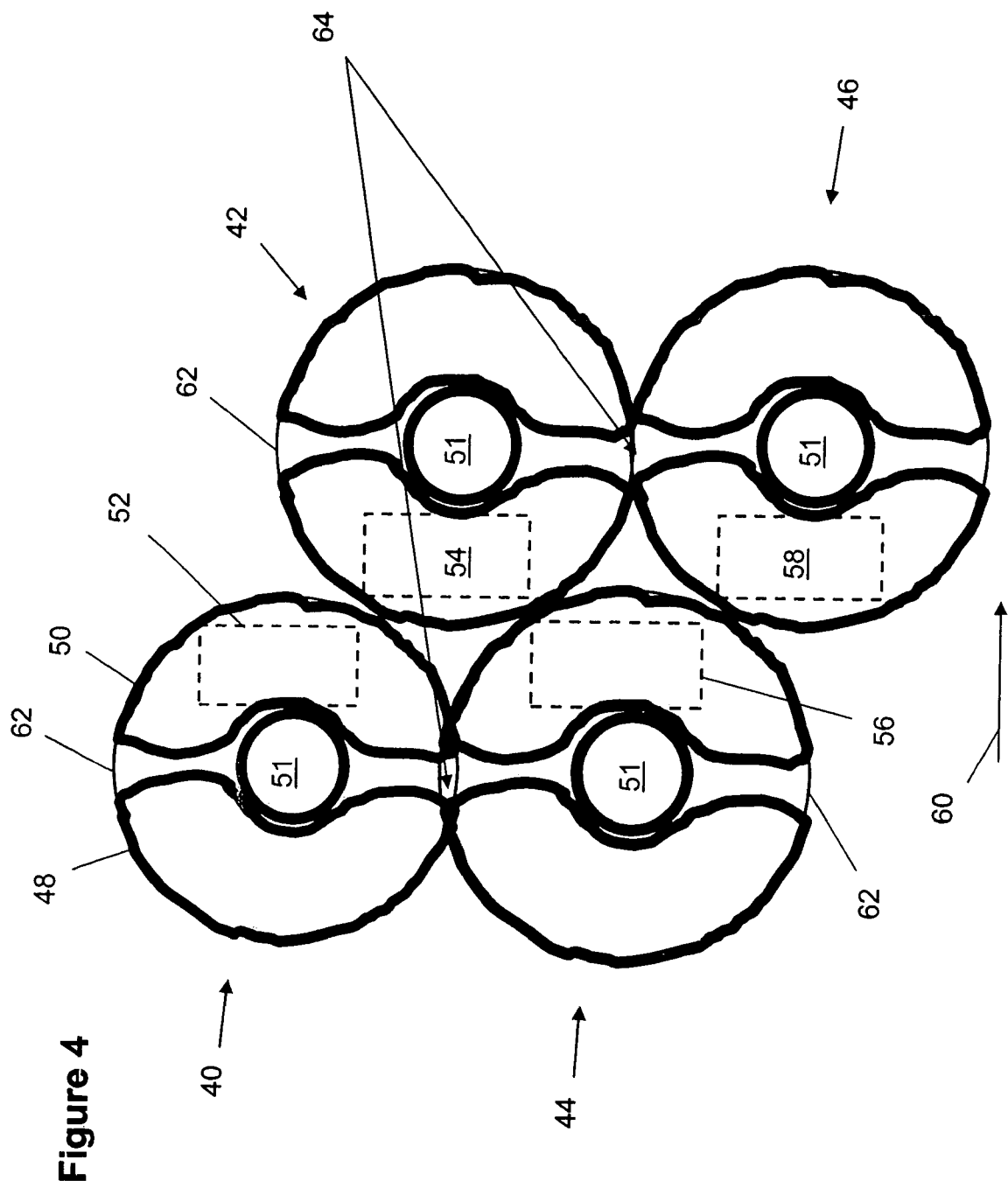
FIG. 4 is a schematic diagram showing an array of four mirror imaging systems.

FIG. 4 shows an array of four mirror imaging systems 40, 42, 44, and 46, which can be used to form part of a projection system for the lithographic apparatus of FIG. 1. The array may comprise more than four mirror imaging systems; however, for the sake of clarity, only four are shown in FIG. 4. Each mirror imaging system 40, 42, 44, 46 includes a primary concave mirror that is divided into a first mirror portion 48 and a second mirror portion 50. A smaller secondary convex mirror 51 is arranged concentrically with the primary concave mirror. The array of mirror imaging systems shown in FIG. 4 can be used to pattern a relatively large area of a substrate, and thereby avoid the need to use a larger single mirror imaging system, which because of its greater size and weight would be more likely to suffer deformation leading to errors.

In an embodiment, the two mirror portions 48 and 50 of the primary mirror are formed, for example, by cutting a single concave mirror into two. Other manufacturing methods for forming the two mirror portions 48 and 50 can also be used. Because each mirror imaging system of the array in FIG. 4 has two mirror portions 48 and 50, the array provides more movement possibilities and more degrees of freedom than would otherwise be possible. In an embodiment, each individual mirror portion 48 and 50 can be moved separately with three degrees of freedom.

In FIG. 4, four imaging fields 52, 54, 56, and 58 are indicated schematically as dotted rectangles. Although the imaging fields are shown as rectangles, in embodiments, they are banana-shaped. The imaging fields 52, 54, 56, and 58 are arranged so that there are no gaps between the imaging fields when the substrate is scanned in a scanning direction 60. In one embodiment, the imaging fields 52, 54, 56, and 58 overlap each other.

Although the imaging fields are illustrated on only one half of each mirror imaging system 40, 42, 44, and 46, both mirror portions 48 and 50 of the primary mirror of the mirror imaging systems 40, 42, 44, and 46 are used.

In FIG. 4, the general shape of each concave mirror is illustrated by a circle 62. The approximate shape of each mirror portions 48 and 50 is shown on the circle 62 using a thicker black line. This serves to illustrate that by cutting the mirror portions 48 and 50 so as to reduce their maximum dimension, it is possible to arrange the mirror portions 48 and 50 so that the circles 62 overlap in the regions labeled 64. This ensures that there are no gaps between the imaging fields 52, 54, 56 and 58 when the substrate is scanned in scanning direction 60.

Although the schematic diagram of FIG. 4 shows the mirror portions 48 and 50 in contact with other mirror portions, the mirror portions are typically arranged so that no mirror portion is in contact with any other mirror portion. This is done to avoid any mechanical interference between the mirror portions and to avoid the possibility of any vibrations being transmitted from one mirror portion to another.

As illustrated in FIG. 4, the mirror imaging systems 40, 42, 44, and 46 are arranged in two rows, with each row being perpendicular to the scanning direction 60. In FIG. 4 only two mirror imaging systems are shown in each row, but each row may contain many more such imaging systems. The mirror imaging systems in one row are positioned halfway between (e.g., 180 degrees out of phase with) the mirror imaging systems in the other row.

Figure 5:
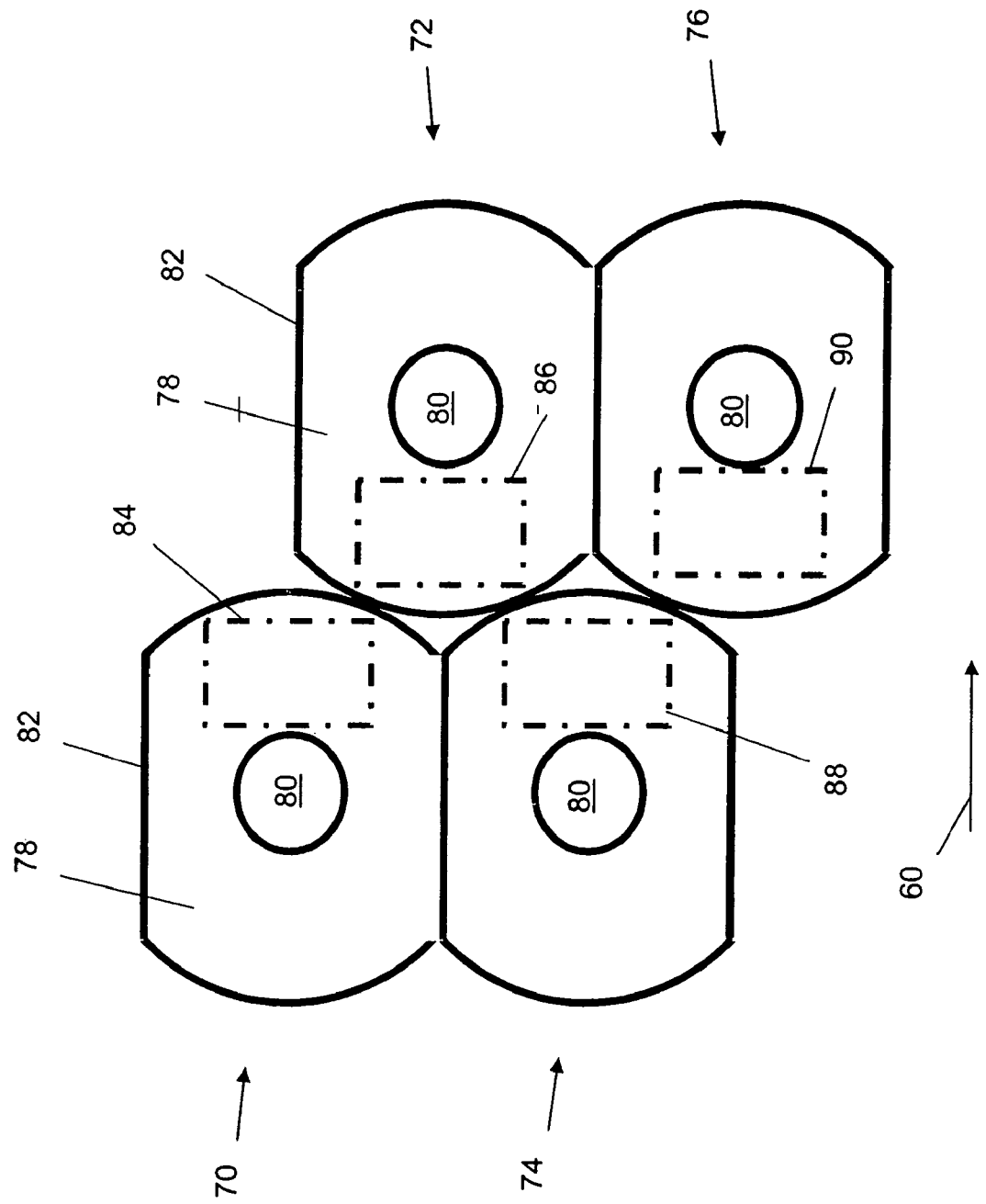
FIG. 5 is a schematic diagram of an alternative array of mirror imaging systems.

FIG. 5 shows an alternative embodiment to FIG. 4. Again, four mirror imaging systems 70, 72, 74, and 76, which form part of a larger array are shown. Each mirror imaging system comprises a primary concave mirror 78 and a secondary convex mirror 80. In this embodiment, the primary mirrors are not cut into two mirror portions, but instead the top and bottom of each primary mirror is cut off along a straight line 82. This allows the mirror imaging systems 70, 72, 74, and 76 to be moved closer together in a direction perpendicular to the scanning direction 60. Moving the imaging systems closer together ensures that there are no gaps between the imaging fields 84, 86, 88 and 90 when the substrate is scanned in the scanning direction 60. In embodiments, the imaging fields 84, 86, 88 and 90 are banana-shaped. Additionally, although the primary mirrors 78 in FIG. 5 are shown as touching each other, in embodiments, there is no contact between any of the primary mirrors, for the reasons noted above with reference to the array of FIG. 4.

Figure 6:
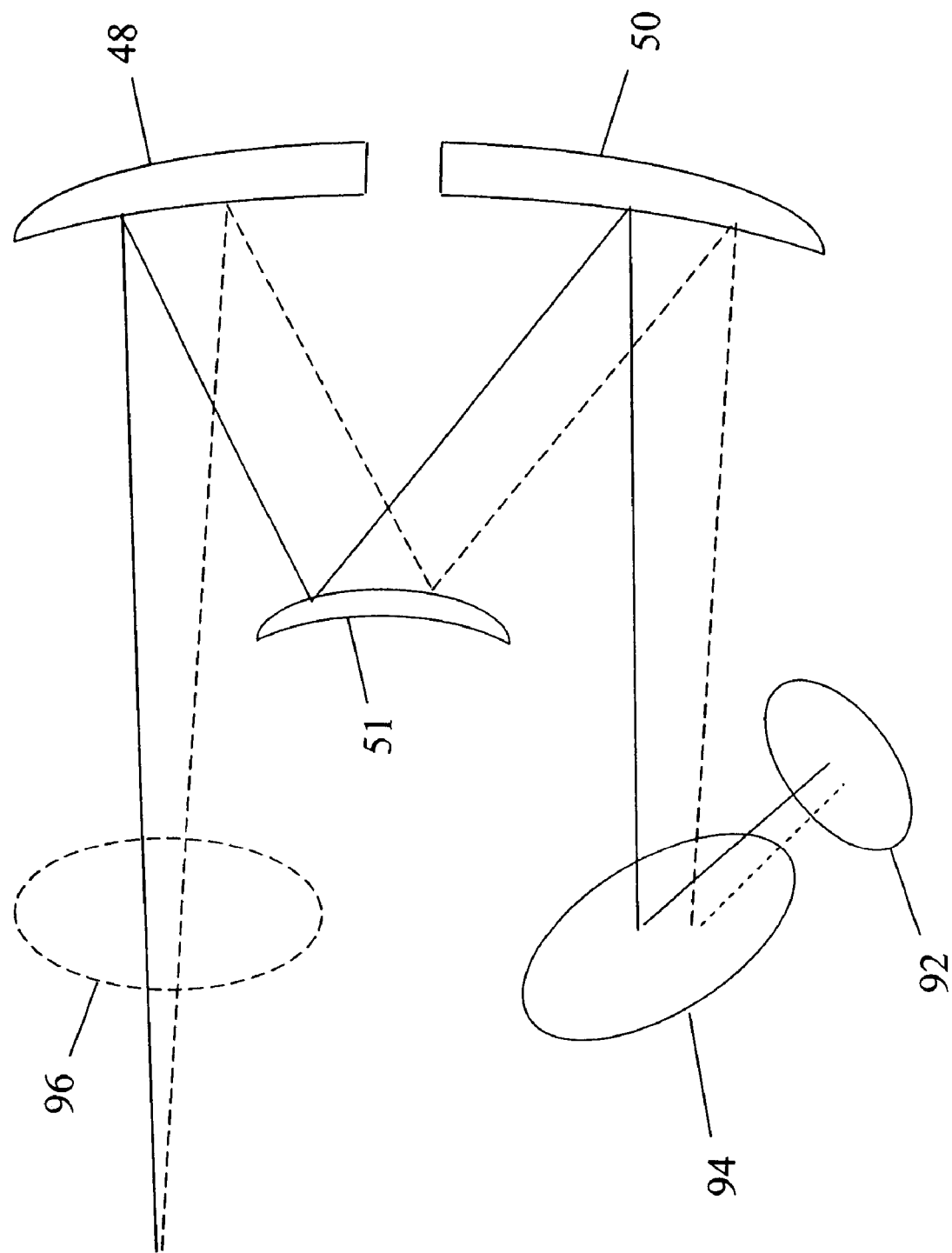
FIG. 6 is a schematic diagram of a mirror imaging system that comprises a number of flat mirrors which ensure that the image has the correct orientation.

FIG. 6 shows a more detailed view of one of the mirror imaging systems of FIG. 4. The mirror imaging system comprising a primary concave mirror having two mirror portions 48 and 50 and the secondary convex mirror 51. The mirror imaging system is further provided with first and second flat circular mirrors 92 and 94 respectively. These are positioned so as to direct light from a reticle (not shown) to the mirror portion 50. The reticle would be positioned above the plane of the paper. Thus, light from the reticle travels down onto the flat mirror 92 in a direction perpendicular to the plane of the paper. It is reflected from the flat mirror 92 to the flat mirror 94, and from the flat mirror 94 to the mirror portion 50. The light is then reflected to the secondary convex mirror 51, to the mirror portion 48, and from there to the substrate (not shown).

An optional third circular flat mirror 96, which is shown in dotted lines to indicate that it is optional, is assumed not to be present, and the light is therefore shown as continuing straight on past the position of the third mirror 96 to the substrate (not shown). However, if present, the third flat mirror 96 can be used to change the direction of the light, in which case the substrate can be placed in a different position.

In the embodiment, each of the separate mirror imaging systems of FIG. 4 is provided with a respective first and second flat mirror (and possibly also a third flat mirror) as shown in FIG. 6. The effect of the first and second flat mirrors 92 and 94 is to ensure that the orientation of the image of the reticle produced by each mirror imaging system is correct when it reaches the substrate. Thus, because the first and second flat mirrors 92 and 94 are used, it is not necessary to change the pattern on the reticle to allow for the image inversion produced by each mirror imaging system.

The flat mirrors 92, 94 and 96 shown in FIG. 6 can also be provided for each of the mirror imaging systems of the embodiment of FIG. 5 in the same way.

Although FIGS. 2 to 5 show each imaging system as containing two curved mirrors, it should be understood that the invention is equally applicable to imaging systems which contain a greater number of optical elements.

Although specific reference may be made in this text to the use of lithographic apparatus in the manufacture of ICs, it should be understood that the lithographic apparatus described herein may have other applications, such as the manufacture of integrated optical systems, optical waveguides, detection patterns for magnetic domain memories, flat-panel displays, liquid-crystal displays (LCDs), thin-film magnetic heads, et cetera. A person skilled in the relevant art(s) will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Furthermore, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. Thus, it will be apparent to one skilled in the relevant art(s) that modifications may be made to the invention as described without departing from the scope of the claims set out below.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A projection system for projecting radiation onto a substrate, comprising:
   a plurality of mirror imaging systems each comprising at least a concave mirror and a convex mirror, wherein each mirror imaging system is arranged to direct radiation onto an associated imaging field at the substrate, wherein each concave mirror comprises a separate first mirror portion and a second mirror portion, the first and second mirror portions being independently moveable;
   a first flat mirror arranged to direct incident light towards the concave mirror; and
   a second flat mirror arranged to reflect light from a patterning device to the first flat mirror; wherein the first flat mirror and the second flat mirror are arranged so as to receive an image from the patterning device and to reflect the image to the concave mirror so that the orientation of the image at the substrate is the same as the orientation of a corresponding portion of the patterning device producing the image.

2. The projection system of claim 1, wherein each convex mirror is arranged concentrically with its respective concave mirror.

3. The projection system of claim 1, wherein the concave mirrors of each mirror imaging system are shaped to allow the mirror imaging systems to be arranged in a manner that precludes gaps between adjacent imaging fields in a scanning direction.

4. The projection system of claim 1, wherein the mirror imaging systems are arranged in a first row and a second row with each row being perpendicular to a scanning direction.

5. The projection system of claim 4, wherein the second row of the mirror imaging systems is a mirror image of the first row of the mirror imaging systems such that the first and second row establish imaging fields on the opposite sides of a plane.

6. The projection system of claim 4, wherein the mirror imaging systems are arranged in a manner that precludes gaps between adjacent imaging fields in a scanning direction.

7. The projection system of claim 1, wherein the final image formed by all of the mirror imaging systems at the substrate corresponds with the patterning device as a whole.

8. The projection system of claim 1, further comprising a third flat mirror arranged to reflect light from the concave mirror to a substrate.

9. A lithographic apparatus, comprising:
   an illumination system that supplies a beam of radiation;
   a patterning device that imparts the beam of radiation with a pattern;
   a substrate table that supports a substrate;
   a projection system that projects the patterned beam of radiation onto a target portion of the substrate, the projection system comprises a plurality of mirror imaging systems, each mirror imaging system comprising at least a concave mirror and a convex mirror arranged to direct incident radiation onto an associated imaging field at the substrate, wherein each concave mirror comprises a separate first mirror portion and a second mirror portion, the first and second mirror portions being independently moveable;
   a first flat mirror arranged to direct incident light towards the concave mirror; and
   a second flat mirror arranged to reflect light from a patterning device to the first flat mirror;
   wherein the first flat mirror and the second flat mirror are arranged so as to receive an image from the patterning device and to reflect the image to the concave mirror so that the orientation of the image at the substrate is the same as the orientation of a corresponding portion of the patterning device producing the image.

10. The lithographic apparatus of claim 9, where the patterning device comprises a mask.

11. The lithographic apparatus of claim 9, where the patterning device comprises an array of individually controllable light modulating elements.

12. A device manufacturing method, comprising:
   (1) emitting a beam of radiation;
   (2) imparting the beam of radiation with a pattern; and
   (3) projecting the patterned beam of radiation onto a substrate, wherein the patterned beam of radiation is projected onto the substrate using a projection system comprises a plurality of mirror imaging systems, each mirror imaging system comprising at least a concave mirror and a convex mirror arranged to direct radiation onto an associated imaging field at the substrate, wherein each concave mirror comprises a separate first mirror portion and a second mirror portion, the first and second mirror portions being independently moveable;
   a first flat mirror arranged to direct incident light towards the concave mirror; and
   a second flat mirror arranged to reflect light from a patterning device to the first flat mirror;
   wherein the first flat mirror and the second flat mirror are arranged so as to receive an image from the patterning device and to reflect the image to the concave mirror in a way that the orientation of the image at the substrate is the same as the orientation of a corresponding portion of the patterning device producing the image.

13. A flat panel display comprising a substrate produced using the method of claim 12.

* * * * *